United States Patent
Taylor et al.

(10) Patent No.: US 11,581,697 B2
(45) Date of Patent: Feb. 14, 2023

(54) DETECTOR SYSTEM COMPARING PIXEL RESPONSE WITH PHOTONIC ENERGY DECAY

(71) Applicant: Allegro MicroSystems, LLC, Manchester, NH (US)

(72) Inventors: William P. Taylor, Amherst, NH (US); Bryan Cadugan, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 135 days.

(21) Appl. No.: 17/197,328

(22) Filed: Mar. 10, 2021

(65) Prior Publication Data
US 2022/0294172 A1    Sep. 15, 2022

(51) Int. Cl.
| | | |
|---|---|---|
| *H01S 3/10* | (2006.01) | |
| *H01S 5/00* | (2006.01) | |
| *H01S 5/068* | (2006.01) | |
| *H01S 5/50* | (2006.01) | |
| *H01S 3/0915* | (2006.01) | |
| *H01S 3/0941* | (2006.01) | |
| *H01S 3/30* | (2006.01) | |
| *H01S 5/026* | (2006.01) | |
| *H01S 5/40* | (2006.01) | |

(52) U.S. Cl.
CPC ........ *H01S 5/0028* (2013.01); *H01S 5/06812* (2013.01); *H01S 5/5063* (2013.01); *H01S 3/0915* (2013.01); *H01S 3/0941* (2013.01); *H01S 3/302* (2013.01); *H01S 5/0262* (2013.01); *H01S 5/4025* (2013.01); *H01S 5/50* (2013.01)

(58) Field of Classification Search
CPC .. H01S 5/0028; H01S 5/06812; H01S 5/5063; H01S 3/0915; H01S 3/0941; H01S 3/302; H01S 5/0262; H01S 5/4025; H01S 5/50
See application file for complete search history.

(56) References Cited

U.S. PATENT DOCUMENTS

| | | |
|---|---|---|
| 4,785,191 A | 11/1988 | Ondris |
| 6,760,145 B1 | 7/2004 | Taylor et al. |
| 6,778,728 B2 | 8/2004 | Taylor et al. |
| 6,894,823 B2 | 5/2005 | Taylor et al. |
| 6,989,921 B2 | 1/2006 | Bernstein et al. |
| 7,015,780 B2 | 3/2006 | Bernstein et al. |
| 7,160,753 B2 | 1/2007 | Williams, Jr. |
| 7,432,537 B1 | 10/2008 | Huntington |

(Continued)

FOREIGN PATENT DOCUMENTS

| | | |
|---|---|---|
| DE | 19936441 A1 | 3/2001 |
| TW | 201422772 | 6/2014 |

OTHER PUBLICATIONS

U.S. Appl. No. 17/199,790, filed Mar. 12, 2021, Stary et al.
(Continued)

*Primary Examiner* — Kinam Park
(74) *Attorney, Agent, or Firm* — Daly Crowley Mofford & Durkee, LLP

(57) ABSTRACT

Methods and apparatus for a controlling a stimulus source to direct photons to a pixel in a pixel array contained in a detector system, analyzing a response of the pixel in the pixel array; and generating an alert based on the response of the pixel in the pixel array. Example stimulus sources include a conductive trace, a PN junction, and a current source.

25 Claims, 8 Drawing Sheets

(56) References Cited

U.S. PATENT DOCUMENTS

| | | | |
|---|---|---|---|
| 7,504,053 B1 | 3/2009 | Alekel | |
| 7,764,719 B2 | 7/2010 | Munroe et al. | |
| 7,782,911 B2 | 8/2010 | Munroe et al. | |
| 7,852,549 B2 | 12/2010 | Alekel et al. | |
| 7,885,298 B2 | 2/2011 | Munroe | |
| 7,994,421 B2 | 8/2011 | Williams et al. | |
| 8,207,484 B1 | 6/2012 | Williams | |
| 8,319,307 B1 | 11/2012 | Williams | |
| 8,570,372 B2 | 10/2013 | Russell | |
| 8,597,544 B2 | 12/2013 | Alekel | |
| 8,630,036 B2 | 1/2014 | Munroe | |
| 8,630,320 B2 | 1/2014 | Munroe et al. | |
| 8,730,564 B2 | 5/2014 | Alekel | |
| 8,743,453 B2 | 6/2014 | Alekel et al. | |
| 8,760,499 B2 | 6/2014 | Russell | |
| 8,766,682 B2 | 7/2014 | Williams | |
| 8,853,639 B2 | 10/2014 | Williams, Jr. | |
| 9,121,762 B2 | 9/2015 | Williams et al. | |
| 9,197,233 B2 | 11/2015 | Gaalema et al. | |
| 9,269,845 B2 | 2/2016 | Williams et al. | |
| 9,368,933 B1 | 6/2016 | Nijjar et al. | |
| 9,389,060 B2 | 7/2016 | Romero et al. | |
| 9,397,469 B1 | 7/2016 | Nijjar et al. | |
| 9,447,299 B2 | 9/2016 | Schut et al. | |
| 9,451,554 B1 | 9/2016 | Singh et al. | |
| 9,466,745 B2 | 10/2016 | Williams et al. | |
| 9,553,216 B2 | 1/2017 | Williams et al. | |
| 9,591,238 B2 | 3/2017 | Lee et al. | |
| 9,693,035 B2 | 6/2017 | Williams et al. | |
| 9,759,602 B2 | 9/2017 | Williams | |
| 9,804,264 B2 | 10/2017 | Villeneuve et al. | |
| 9,810,775 B1 | 11/2017 | Welford et al. | |
| 9,810,777 B2 | 11/2017 | Williams et al. | |
| 9,810,786 B1 | 11/2017 | Welford et al. | |
| 9,812,838 B2 | 11/2017 | Villeneuve et al. | |
| 9,823,353 B2 | 11/2017 | Eichenholz et al. | |
| 9,835,490 B2 | 12/2017 | Williams et al. | |
| 9,841,495 B2 | 12/2017 | Campbell et al. | |
| 9,843,157 B2 | 12/2017 | Williams | |
| 9,847,441 B2 | 12/2017 | Huntington | |
| 9,857,468 B1 | 1/2018 | Eichenholz et al. | |
| 9,869,754 B1 | 1/2018 | Campbell et al. | |
| 9,874,635 B1 | 1/2018 | Eichenholz et al. | |
| 9,897,687 B1 | 2/2018 | Campbell et al. | |
| 9,905,992 B1 | 2/2018 | Welford et al. | |
| 9,923,331 B2 | 3/2018 | Williams | |
| 9,941,433 B2 | 4/2018 | Williams et al. | |
| 9,958,545 B2 | 5/2018 | Eichenholz et al. | |
| 9,989,629 B1 | 6/2018 | LaChapelle | |
| 9,995,622 B2 | 6/2018 | Williams | |
| 10,003,168 B1 | 6/2018 | Villeneuve | |
| 10,007,001 B1 | 6/2018 | LaChapelle et al. | |
| 10,012,732 B2 | 7/2018 | Eichenholz et al. | |
| 10,061,019 B1 | 8/2018 | Campbell et al. | |
| 10,088,559 B1 | 10/2018 | Weed et al. | |
| 10,094,925 B1 | 10/2018 | LaChapelle | |
| 10,114,111 B2* | 10/2018 | Russell | G01S 7/4868 |
| 10,121,813 B2 | 11/2018 | Eichenholz et al. | |
| 10,139,478 B2 | 11/2018 | Gaalema et al. | |
| 10,169,678 B1 | 1/2019 | Sachdeva et al. | |
| 10,169,680 B1 | 1/2019 | Sachdeva et al. | |
| 10,175,345 B2 | 1/2019 | Rhee et al. | |
| 10,175,697 B1 | 1/2019 | Sachdeva et al. | |
| 10,191,155 B2 | 1/2019 | Curatu | |
| 10,209,359 B2 | 2/2019 | Russell et al. | |
| 10,209,732 B2 | 2/2019 | Cook | |
| 10,211,592 B1 | 2/2019 | Villeneuve et al. | |
| 10,211,593 B1 | 2/2019 | Lingvay et al. | |
| 10,217,889 B2 | 2/2019 | Dhulla et al. | |
| 10,218,144 B2 | 2/2019 | Munroe et al. | |
| 10,241,198 B2 | 3/2019 | LaChapelle et al. | |
| 10,254,388 B2 | 4/2019 | LaChapelle et al. | |
| 10,254,762 B2 | 4/2019 | McWhirter et al. | |
| 10,267,898 B2 | 4/2019 | Campbell et al. | |
| 10,267,899 B2* | 4/2019 | Weed | G01S 7/4817 |
| 10,267,918 B2 | 4/2019 | LaChapelle et al. | |
| 10,275,689 B1 | 4/2019 | Sachdeva et al. | |
| 10,295,668 B2 | 5/2019 | LaChapelle et al. | |
| 10,310,058 B1 | 6/2019 | Campbell et al. | |
| 10,324,170 B1 | 6/2019 | Engberg, Jr. et al. | |
| 10,324,185 B2 | 6/2019 | McWhirter et al. | |
| 10,338,199 B1 | 7/2019 | McWhirter et al. | |
| 10,338,223 B1 | 7/2019 | Englard et al. | |
| 10,340,651 B1 | 7/2019 | Drummer et al. | |
| 10,345,437 B1 | 7/2019 | Russell et al. | |
| 10,345,447 B1 | 7/2019 | Hicks | |
| 10,348,051 B1 | 7/2019 | Shah et al. | |
| 10,386,489 B2 | 8/2019 | Albelo et al. | |
| 10,394,243 B1 | 8/2019 | Ramezani et al. | |
| 10,401,480 B1 | 9/2019 | Gaalema et al. | |
| 10,401,481 B2 | 9/2019 | Campbell et al. | |
| 10,418,776 B2 | 9/2019 | Welford et al. | |
| 10,445,599 B1 | 10/2019 | Hicks | |
| 10,451,716 B2 | 10/2019 | Hughes et al. | |
| 10,473,788 B2 | 11/2019 | Englard et al. | |
| 10,481,605 B1 | 11/2019 | Maila et al. | |
| 10,488,496 B2 | 11/2019 | Campbell et al. | |
| 10,491,885 B1 | 11/2019 | Hicks | |
| 10,502,831 B2 | 12/2019 | Eichenholz | |
| 10,503,172 B2 | 12/2019 | Englard et al. | |
| 10,509,127 B2 | 12/2019 | Englard et al. | |
| 10,514,462 B2 | 12/2019 | Englard et al. | |
| 10,520,602 B2 | 12/2019 | Villeneuve et al. | |
| 10,523,884 B2 | 12/2019 | Lee et al. | |
| 10,535,191 B2 | 1/2020 | Sachdeva et al. | |
| 10,539,665 B1 | 1/2020 | Danziger et al. | |
| 10,545,240 B2 | 1/2020 | Campbell et al. | |
| 10,551,485 B1 | 2/2020 | Maheshwari et al. | |
| 10,551,501 B1 | 2/2020 | LaChapelle | |
| 10,557,939 B2 | 2/2020 | Campbell et al. | |
| 10,557,940 B2 | 2/2020 | Eichenholz et al. | |
| 10,571,567 B2 | 2/2020 | Campbell et al. | |
| 10,571,570 B1 | 2/2020 | Paulsen et al. | |
| 10,578,720 B2 | 3/2020 | Hughes et al. | |
| 10,591,600 B2 | 3/2020 | Villeneuve et al. | |
| 10,591,601 B2 | 3/2020 | Hicks et al. | |
| 10,606,270 B2 | 3/2020 | Englard et al. | |
| 10,627,495 B2 | 4/2020 | Gaalema et al. | |
| 10,627,512 B1 | 4/2020 | Hicks | |
| 10,627,516 B2 | 4/2020 | Eichenholz | |
| 10,627,521 B2 | 4/2020 | Englard et al. | |
| 10,636,285 B2 | 4/2020 | Haas et al. | |
| 10,641,874 B2 | 5/2020 | Campbell et al. | |
| 10,663,564 B2 | 5/2020 | LaChapelle | |
| 10,663,585 B2 | 5/2020 | McWhirter | |
| 10,677,897 B2 | 6/2020 | LaChapelle et al. | |
| 10,677,900 B2 | 6/2020 | Russell et al. | |
| 10,684,360 B2 | 6/2020 | Campbell | |
| 2010/0038520 A1* | 2/2010 | Yenisch | G01S 17/04 250/208.3 |
| 2014/0293265 A1* | 10/2014 | Stettner | G01S 17/06 356/4.01 |
| 2018/0069367 A1 | 3/2018 | Villeneuve et al. | |
| 2018/0284239 A1 | 10/2018 | LaChapelle et al. | |
| 2018/0284240 A1 | 10/2018 | LaChapelle et al. | |
| 2018/0284275 A1 | 10/2018 | LaChapelle | |
| 2018/0284280 A1 | 10/2018 | Eichenholz et al. | |
| 2019/0242995 A1 | 8/2019 | Dort et al. | |
| 2019/0310368 A1 | 10/2019 | LaChapelle | |
| 2020/0284883 A1 | 9/2020 | Ferreira et al. | |
| 2020/0341126 A1* | 10/2020 | Yates | G01S 7/4863 |
| 2022/0163401 A1 | 5/2022 | Herceg et al. | |
| 2022/0182563 A1 | 6/2022 | Mun | |

OTHER PUBLICATIONS

U.S. Appl. No. 17/566,763, filed Dec. 31, 2021, Huntington et al.
U.S. Appl. No. 17/648,702, filed Jan. 24, 2022, Lee et al.
U.S. Appl. No. 17/651,250, filed Feb. 16, 2022, Marshall.
U.S. Appl. No. 17/653,881, filed Mar. 8, 2022, Keuleyan et al.
U.S. Appl. No. 17/656,977, filed Mar. 29, 2022, Myers et al.
U.S. Appl. No. 17/656,978, filed Mar. 29, 2022, Myers et al.
U.S. Appl. No. 17/656,981, filed Mar. 29, 2022, Myers et al.

(56) References Cited

OTHER PUBLICATIONS

U.S. Appl. No. 17/663,896, filed May 18, 2022, Cadugan et al.
PCT International Search Report and Written Opinion dated May 24, 2022 for International Application No. PCT/US2022/017405; 13 Pages.
U.S. Appl. No. 17/197,314, filed Mar. 10, 2021, Taylor et al.
U.S. Appl. No. 17/352,829, filed Jun. 21, 2021, Huntington et al.
U.S. Appl. No. 17/352,937, filed Jun. 21, 2021, Cadugan et al.
U.S. Appl. No. 17/376,607, filed Jul. 15, 2021, Stewart et al.
U.S. Appl. No. 17/400,300, filed Aug. 12, 2021, Myers et al.
U.S. Appl. No. 17/402,065, filed Aug. 13, 2021, Lee et al.
U.S. Appl. No. 17/230,253, filed Apr. 14, 2021, Judkins, III et al.
U.S. Appl. No. 17/230,276, filed Apr. 14, 2021, Cadugan.
U.S. Appl. No. 17/230,277, filed Apr. 14, 2021, Judkins, III et al.
U.S. Non-Final Office Action dated Sep. 30, 2022 for U.S. Appl. No. 17/230,253; 12 Pages.

* cited by examiner

DETECTOR SYSTEM COMPARING PIXEL RESPONSE WITH PHOTONIC ENERGY DECAY

BACKGROUND

As is known in the art, some known ranging systems can include laser radar (ladar), light-detection and ranging (lidar), and rangefinding systems, to measure the distance to objects in a scene. A laser ranging and imaging system emits a pulse toward a particular location and measures the return echoes to extract the range.

Conventional laser ranging systems generally work by emitting a laser pulse and recording the time it takes for the laser pulse to travel to a target, reflect, and return to a photoreceiver. The laser ranging instrument records the time of the outgoing pulse and records the time that a laser pulse returns. The difference between these two times is the time of flight to and from the target. Using the speed of light, the round-trip time of the pulses is used to calculate the distance to the target.

SUMMARY

Example embodiments of the disclosure provide methods and apparatus for a photonic integrated circuit, such as a readout integrated circuit (ROIC), having safety features, such as Automotive Safety Integrity Level (ASIL) related features. In embodiments, one or more features are embedded into a ROIC to enable ASIL compliance from a photoreceiver for use in various applications, such as automotive applications.

A photonic system can include a detector pixel having thin conductive traces to generate photonic energy at the sensitivity level of the photonic system. In embodiments, a LED is located proximate the detector pixel to generate a photon in response to an electrical signal. This LED may also be located within the package or even outside of the Photoreceiver System that the Photonic ROIC is a part of. The ROIC would then control the LED output directly. By generating photons directly, the entire signal path of the photoreceiver can be verified. In another embodiment, a voltage is applied to a trace to force a known voltage. A current source can be used in place of the pixel.

In some embodiments, a ROIC generates an alert if a return pulse is not detected within a certain time window versus the nominal response of not returning data. In one embodiment, a ROIC applies a known signal to the pixel or a pixel array and waits for a response from the pixel and circuit in the ROIC. In an embodiment, a ROIC can include pulse validation. For example, if the amplitude of a returned pulse versus time is not within an expected range, an alert can be generated. In embodiments, a shape of a pulse can be evaluated. For example, the shape of a pulse can be confirmed to match an expected shape to eliminate potentially spurious pulses from the overall environment.

In embodiments, a ROIC can include direct electrical stimulation through current generation to validate functionality from transimpedance amplifier (TIA) through backend. Dynamic photodetector voltage bias modulation over time can be evaluated by the ROIC on a low side to validate current response to be consistent with a properly functioning photodetector. In some embodiments, a ROIC can include an ASIL signal output on a separate pin or pins of the package.

In one aspect, a method comprises: controlling a stimulus source to direct photons to a pixel in a pixel array contained in a detector system; analyzing a response of the pixel in the pixel array; and generating an alert based on the response of the pixel in the pixel array.

A method can further include one or more of the following features: the stimulus source comprises a metal object and controlling the stimulus source comprises heating the metal object, the stimulus source comprises a current source, the stimulus source comprises a PN junction providing a light emitting diode (LED), analyzing the response of the pixel in the pixel array comprises determining that a response was not generated with a given period of time corresponding to a given distance, generating the alert based on the response of the pixel in the pixel array corresponds to the determining that the response was not generated with the given period of time corresponding to the given distance, analyzing the response of the pixel in the pixel array comprises determining that the response was not generated with the given period of time corresponding to the given distance after the stimulus source to direct photons to the pixel in the pixel array was controlled to stimulate the pixel and generate the response, the detector system comprises a photodiode coupled to an amplifier which provide an output to a comparator, the comparator comprises a digital circuit, the detector system further comprises a first voltage threshold coupled to an input of the comparator and an output of the comparator is used to analyze the response of the pixel in the pixel array, the detector array further comprises a multiplexer to multiplex an output of the pixel and a test signal, wherein an output of the multiplexer is coupled to the amplifier, a readout integrated circuit performs the controlling of the stimulus source, the readout integrated circuit is external to the detector array, and/or a readout integrated circuit controls the stimulus source to direct the photons to the pixels in the pixel array at a selected time.

In another aspect, a detector system comprises: a stimulus source to direct photons to pixels in a pixel array contained in the detector system; a first module to analyze a response of the pixels in the pixel array; and a second module to generate an alert based on the response of the pixels in the pixel array.

A system can further include one or more of following features: the stimulus source comprises a metal object that can be heated, the stimulus source comprises a current source, the stimulus source comprises a PN junction providing a light emitting diode (LED), the first module is configured to analyze the response of the pixels in the pixel array by determining that a response was not generated with a given period of time corresponding to a given distance, the alert is generated based on the response of the pixels in the pixel array by determining that the response was not generated with the given period of time corresponding to the given distance, the first module is configured to analyze the response of the pixels in the pixel array by determining that the response was not generated with the given period of time corresponding to the given distance after the stimulus source to direct photons to the pixels in the pixel array was controlled to stimulate the pixel and generate the response, the detector system comprises a photodiode coupled to an amplifier which provides an output to a comparator, the comparator comprises a digital circuit, the detector system further comprises a first voltage threshold coupled to an input of the comparator and an output of the comparator is used to analyze the response of the pixels in the pixel array, the detector array further comprises a multiplexer to multiplex an output of the pixels and a test signal, wherein an output of the multiplexer is coupled to the amplifier, a readout integrated circuit is configured to control the stimulus source, the readout integrated circuit is external to the detector array, and/or a readout integrated circuit controls the stimulus source to direct the photons to the pixels in the pixel array at a selected time.

In a further aspect, a method comprises: receiving a return laser pulse at a detector system having pixels in a pixel array; analyzing a response of the pixels in the pixel array including comparing the response to at least one threshold corresponding to decay of photonic energy of the laser pulse over distance and target reflectivity; and generating an alert signal based on the response of the pixels in the pixel array.

A method can further include one or more of the following features: a readout integrated circuit controls a laser that generates the return laser pulse, the at least one threshold comprises a first threshold corresponding to a first reflectivity and a second threshold corresponding to a second reflectivity, analyzing the response comprises determining that real return for the laser pulse corresponds to the response of the pixels in the pixel array being between the first and second thresholds, analyzing the response comprises determining that noise corresponds to the response of the pixels in the pixel array being below the second threshold, analyzing the response comprises determining that noise corresponds to the response of the pixels in the pixel array being above the first threshold, the at least one threshold comprises a first threshold corresponding to a low trigger for a pulse generated by a first type of laser and a second threshold corresponding to a high trigger for the pulse generated by the first type of laser, determining a first time from the returned laser pulse exceeding the first threshold to the returned pulse exceeding the second threshold, determining based on the first time that the returned laser pulse was generated by a second type of laser that is different from the first type of laser, determining that the returned laser pulse was generated by a second type of laser that is different from the first type of laser based upon a pulse width of the returned laser pulse, the first time corresponds to the laser type comprising a fiber laser, and/or the first time corresponds to the laser type comprising a DPSS laser.

In a further aspect, a detector system comprises: a detector to receive a return laser pulse, wherein the detector comprises pixels in a pixel array; a first module configured to analyze a response of the pixels in the pixel array including comparing the response to at least one threshold corresponding to decay of photonic energy of the laser pulse over distance and target reflectivity; and an alert signal configured to generate an alert based on the response of the pixels in the pixel array.

A system can further include one or more of the following features: a readout integrated circuit is configured to control a laser that generates the return laser pulse, the at least one threshold comprises a first threshold corresponding to a first reflectivity and a second threshold corresponding to a second reflectivity, analyzing the response comprises determining that real return for the laser pulse corresponds to the response of the pixels in the pixel array being between the first and second thresholds, analyzing the response comprises determining that noise corresponds to the response of the pixels in the pixel array being below the second threshold, analyzing the response comprises determining that noise corresponds to the response of the pixels in the pixel array being above the first threshold, the at least one threshold comprises a first threshold corresponding to a low trigger for a pulse generated by a first type of laser and a second threshold corresponding to a high trigger for the pulse generated by the first type of laser, the system is further configured to determine a first time from the returned laser pulse exceeding the first threshold to the returned pulse exceeding the second threshold, the system is further configured to determine based on the first time that the returned laser pulse was generated by a second type of laser that is different from the first type of laser, the system is further configured to determine that the returned laser pulse was generated by a second type of laser that is different from the first type of laser based upon a pulse width of the returned laser pulse, the first time corresponds to the laser type comprising a fiber laser, and/or the first time corresponds to the laser type comprising a DPSS laser.

In another aspect, a method comprises: employing an amplifier to amplify signals from a photodetector forming part of a detector system having a pixel array; applying an AC modulation signal to the amplifier, wherein an output signal of the amplifier includes a pulse signal generated by pixels in a pixel array contained in a detector system and the AC modulation signal; analyzing an output signal from the amplifier to detect a fault in operation of the photodetector; and filtering the AC modulation signal from the output signal of the amplifier. A method can further include one or more of the following features: evaluating operation of the photodetector, and/or generating an alert based on the evaluating of the photodetector,

BRIEF DESCRIPTION OF THE DRAWINGS

The foregoing features of this disclosure, as well as the disclosure itself, may be more fully understood from the following description of the drawings in which.

DETAILED DESCRIPTION

Figure 1:
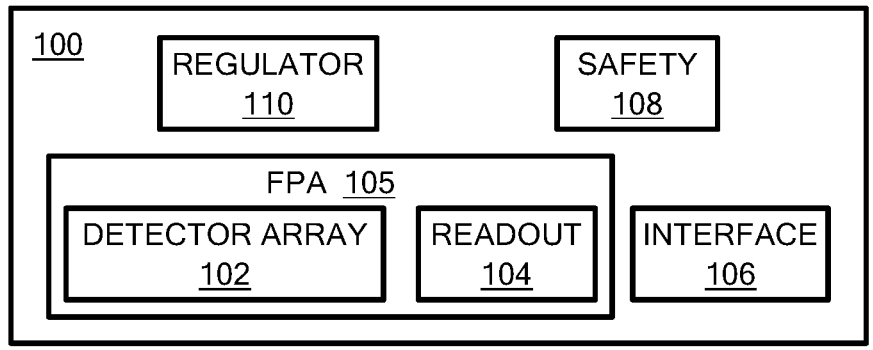
FIG. 1 is a high level block diagram of an example detection system having safety features.

Prior to describing example embodiments of the disclosure some information is provided. Laser ranging systems can include laser radar (ladar), light-detection and ranging (lidar), and rangefinding systems, which are generic terms for the same class of instrument that uses light to measure the distance to objects in a scene. This concept is similar to radar, except optical signals are used instead of radio waves.

Similar to radar, a laser ranging and imaging system emits an optical signal, e.g. a pulse or continuous optical signal, toward a particular location and measures the return echoes to extract the range.

Laser ranging systems generally work by emitting a laser pulse and recording the time it takes for the laser pulse to travel to a target, reflect, and return to a photoreceiver. The laser ranging instrument records the time of the outgoing pulse—either from a trigger or from calculations that use measurements of the scatter from the outgoing laser light—and then records the time that a laser pulse returns. The difference between these two times is the time of flight to and from the target. Using the speed of light, the round-trip time of the pulses is used to calculate the distance to the target.

Lidar systems may scan the beam across a target area to measure the distance to multiple points across the field of view, producing a full three-dimensional range profile of the surroundings. More advanced flash lidar cameras, for example, contain an array of detector elements, each able to record the time of flight to objects in their field of view.

When using light pulses to create images, the emitted pulse may intercept multiple objects, at different orientations, as the pulse traverses a 3D volume of space. The echoed laser-pulse waveform contains a temporal and amplitude imprint of the scene. By sampling the light echoes, a record of the interactions of the emitted pulse is extracted with the intercepted objects of the scene, allowing an accurate multi-dimensional image to be created. To simplify signal processing and reduce data storage, laser ranging and imaging can be dedicated to discrete-return systems, which record only the time of flight (TOF) of the first, or a few, individual target returns to obtain angle-angle-range images. In a discrete-return system, each recorded return corresponds, in principle, to an individual laser reflection (i.e., an echo from one particular reflecting surface, for example, a vehicle, a person, a tree, pole or building). By recording just a few individual ranges, discrete-return systems simplify signal processing and reduce data storage, but they do so at the expense of lost target and scene reflectivity data. Because laser-pulse energy has significant associated costs and drives system size and weight, recording the TOF and pulse amplitude of more than one laser pulse return per transmitted pulse, to obtain angle-angle-range-intensity images, increases the amount of captured information per unit of pulse energy. All other things equal, capturing the full pulse return waveform offers significant advantages, such that the maximum data is extracted from the investment in average laser power. In full-waveform systems, each backscattered laser pulse received by the system is digitized at a high sampling rate (e.g., 500 MHz to 1.5 GHz). This process generates digitized waveforms (amplitude versus time) that may be processed to achieve higher-fidelity 3D images.

Of the various laser ranging instruments available, those with single-element photoreceivers generally obtain range data along a single range vector, at a fixed pointing angle. This type of instrument—which is, for example, commonly used by golfers and hunters—either obtains the range (R) to one or more targets along a single pointing angle or obtains the range and reflected pulse intensity (I) of one or more objects along a single pointing angle, resulting in the collection of pulse range-intensity data, $(R,I)_i$, where i indicates the number of pulse returns captured for each outgoing laser pulse.

More generally, laser ranging instruments can collect ranging data over a portion of the solid angles of a sphere, defined by two angular coordinates (e.g., azimuth and elevation), which can be calibrated to three-dimensional (3D) rectilinear cartesian coordinate grids; these systems are generally referred to as 3D lidar and ladar instruments. The terms "lidar" and "ladar" are often used synonymously and, for the purposes of this discussion, the terms "3D lidar," "scanned lidar," or "lidar" are used to refer to these systems without loss of generality. 3D lidar instruments obtain three-dimensional (e.g., angle, angle, range) data sets. Conceptually, this would be equivalent to using a rangefinder and scanning it across a scene, capturing the range of objects in the scene to create a multi-dimensional image. When only the range is captured from the return laser pulses, these instruments obtain a 3D data set (e.g., angle, angle, range)$_n$, where the index n is used to reflect that a series of range-resolved laser pulse returns can be collected, not just the first reflection.

Some 3D lidar instruments are also capable of collecting the intensity of the reflected pulse returns generated by the objects located at the resolved (angle, angle, range) objects in the scene. When both the range and intensity are recorded, a multi-dimensional data set [e.g., angle, angle, (range-intensity)$_n$] is obtained. This is analogous to a video camera in which, for each instantaneous field of view (FOV), each effective camera pixel captures both the color and intensity of the scene observed through the lens. However, 3D lidar systems, instead capture the range to the object and the reflected pulse intensity.

Lidar systems can include different types of lasers, including those operating at different wavelengths, including those that are not visible (e.g., those operating at a wavelength of 840 nm or 905 nm), and in the near-infrared (e.g., those operating at a wavelength of 1064 nm or 1550 nm), and the thermal infrared including those operating at wavelengths known as the "eyesafe" spectral region (i.e., generally those operating at a wavelength beyond about 1400-nm), where ocular damage is less likely to occur. Lidar transmitters are generally invisible to the human eye. However, when the wavelength of the laser is close to the range of sensitivity of the human eye—roughly 350 nm to 730 nm—the energy of the laser pulse and/or the average power of the laser must be lowered such that the laser operates at a wavelength to which the human eye is not sensitive. Thus, a laser operating at, for example, 1550 nm, can—without causing ocular damage—generally have 200 times to 1 million times more laser pulse energy than a laser operating at 840 nm or 905 nm.

One challenge for a lidar system is detecting poorly reflective objects at long distance, which requires transmitting a laser pulse with enough energy that the return signal—reflected from the distant target—is of sufficient magnitude to be detected. To determine the minimum required laser transmission power, several factors must be considered. For instance, the magnitude of the pulse returns scattering from the diffuse objects in a scene is proportional to their range and the intensity of the return pulses generally scales with distance according to $1/R^4$ for small objects and $1/R^2$ for larger objects; yet, for highly-specularly reflecting objects (i.e., those objects that are not diffusively-scattering objects), the collimated laser beams can be directly reflected back, largely unattenuated. This means that—if the laser pulse is transmitted, then reflected from a target 1 meter away—it is possible that the full energy (J) from the laser pulse will be reflected into the photoreceiver; but—if the laser pulse is transmitted, then reflected from a target 333 meters away—it is possible that the return will have a pulse with energy approximately $10^{12}$ weaker than the transmitted energy.

In many cases of lidar systems highly-sensitive photoreceivers are used to increase the system sensitivity to reduce the amount of laser pulse energy that is needed to reach poorly reflective targets at the longest distances required, and to maintain eyesafe operation. Some variants of these detectors include those that incorporate photodiodes, and/or offer gain, such as avalanche photodiodes (APDs) or single-photon avalanche detectors (SPADs). These variants can be configured as single-element detectors, -segmented-detectors, linear detector arrays, or area detector arrays. Using highly sensitive detectors such as APDs or SPADs reduces the amount of laser pulse energy required for long-distance ranging to poorly reflective targets. The technological challenge of these photodetectors is that they must also be able to accommodate the incredibly large dynamic range of signal amplitudes.

As dictated by the properties of the optics, the focus of a laser return changes as a function of range; as a result, near objects are often out of focus. Furthermore, also as dictated by the properties of the optics, the location and size of the "blur"—i.e., the spatial extent of the optical signal—changes as a function of range, much like in a standard camera. These challenges are commonly addressed by using large detectors, segmented detectors, or multi-element detectors to capture all of the light or just a portion of the light over the full-distance range of objects. It is generally advisable to design the optics such that reflections from close objects are blurred, so that a portion of the optical energy does not reach the detector or is spread between multiple detectors. This design strategy reduces the dynamic range requirements of the detector and prevents the detector from damage.

Acquisition of the lidar imagery can include, for example, a 3D lidar system embedded in the front of car, where the 3D lidar system, includes a laser transmitter with any necessary optics, a single-element photoreceiver with any necessary dedicated or shared optics, and an optical scanner used to scan ("paint") the laser over the scene. Generating a full-frame 3D lidar range image—where the field of view is 20 degrees by 60 degrees and the angular resolution is 0.1 degrees (10 samples per degree)—requires emitting 120,000 pulses [(20*10*60*10)=120,000)]. When update rates of 30 frames per second are required, such as is required for automotive lidar, roughly 3.6 million pulses per second must be generated and their returns captured.

There are many ways to combine and configure the elements of the lidar system—including considerations for the laser pulse energy, beam divergence, detector array size and array format (single element, linear, 2D array), and scanner to obtain a 3D image. If higher power lasers are deployed, pixelated detector arrays can be used, in which case the divergence of the laser would be mapped to a wider field of view relative to that of the detector array, and the laser pulse energy would need to be increased to match the proportionally larger field of view. For example— compared to the 3D lidar above—to obtain same-resolution 3D lidar images 30 times per second, a 120,000-element detector array (e.g., 200×600 elements) could be used with a laser that has pulse energy that is 120,000 times greater. The advantage of this "flash lidar" system is that it does not require an optical scanner; the disadvantages are that the larger laser results in a larger, heavier system that consumes more power, and that it is possible that the required higher pulse energy of the laser will be capable of causing ocular damage. The maximum average laser power and maximum pulse energy are limited by the requirement for the system to be eyesafe.

As noted above, while many lidar system operate by recording only the laser time of flight and using that data to obtain the distance to the first target return (closest) target, some lidar systems are capable of capturing both the range and intensity of one or multiple target returns created from each laser pulse. For example, for a lidar system that is capable of recording multiple laser pulse returns, the system can detect and record the range and intensity of multiple returns from a single transmitted pulse. In such a multi-pulse lidar system, the range and intensity of a return pulse from a from a closer-by object can be recorded, as well as the range and intensity of later reflection(s) of that pulse—one(s) that moved past the closer-by object and later reflected off of more-distant object(s). Similarly, if glint from the sun reflecting from dust in the air or another laser pulse is detected and mistakenly recorded, a multi-pulse lidar system allows for the return from the actual targets in the field of view to still be obtained.

The amplitude of the pulse return is primarily dependent on the specular and diffuse reflectivity of the target, the size of the target, and the orientation of the target. Laser returns from close, highly-reflective objects, are many orders of magnitude greater in intensity than the intensity of returns from distant targets. Many lidar systems require highly sensitive photodetectors, for example avalanche photodiodes (APDs), which along with their CMOS amplification circuits allow low reflectivity targets to be detected, provided the photoreceiver components are optimized for high conversion gain. Largely because of their high sensitivity, these detectors may be damaged by very intense laser pulse returns.

However, capturing the intensity of pulses over a larger dynamic range associated with laser ranging may be challenging because the signals are too large to capture directly. One can infer the intensity by using a recording of a bit-modulated output obtained using serial-bit encoding obtained from one or more voltage threshold levels. This technique is often referred to as time-over-threshold (TOT) recording or, when multiple-thresholds are used, multiple time-over-threshold (MTOT) recording.

FIG. 1 shows an example detector system 100 having safety functionality. A detector array 102, which can comprise a focal plane array (FPA) 105 having an array of pixels, is coupled to a readout module 104, such as a readout integrated circuit (ROIC). Although the FPA 105 is shown as a ROIC and detector array in another embodiment they may comprise one piece of material, for example a silicon FPA. In addition, the READOUT module 106 may comprise a silicon circuit and the detector module 102 may comprises a different material, such as, but not limited to GaAs, InGaAs, InGaAsP, and/or other detector materials.

In embodiments, the detector array 102 can comprise a single pixel, or pixels in one dimension (1D, two dimensions (2D), and/or three dimensions (3D) arrays). An interface module 106 can output the information from the readout module 104. A safety module 108 can analyze operation of the detector system 100 and generate alerts upon detecting one or more faults. In embodiments, the safety module 108 can provide Automotive Safety Integrity Level (ASIL) related functionality, as described more fully below. The detector system 100 can include a regulator 110 to provide one or more regulated voltages for the system.

Figure 2:
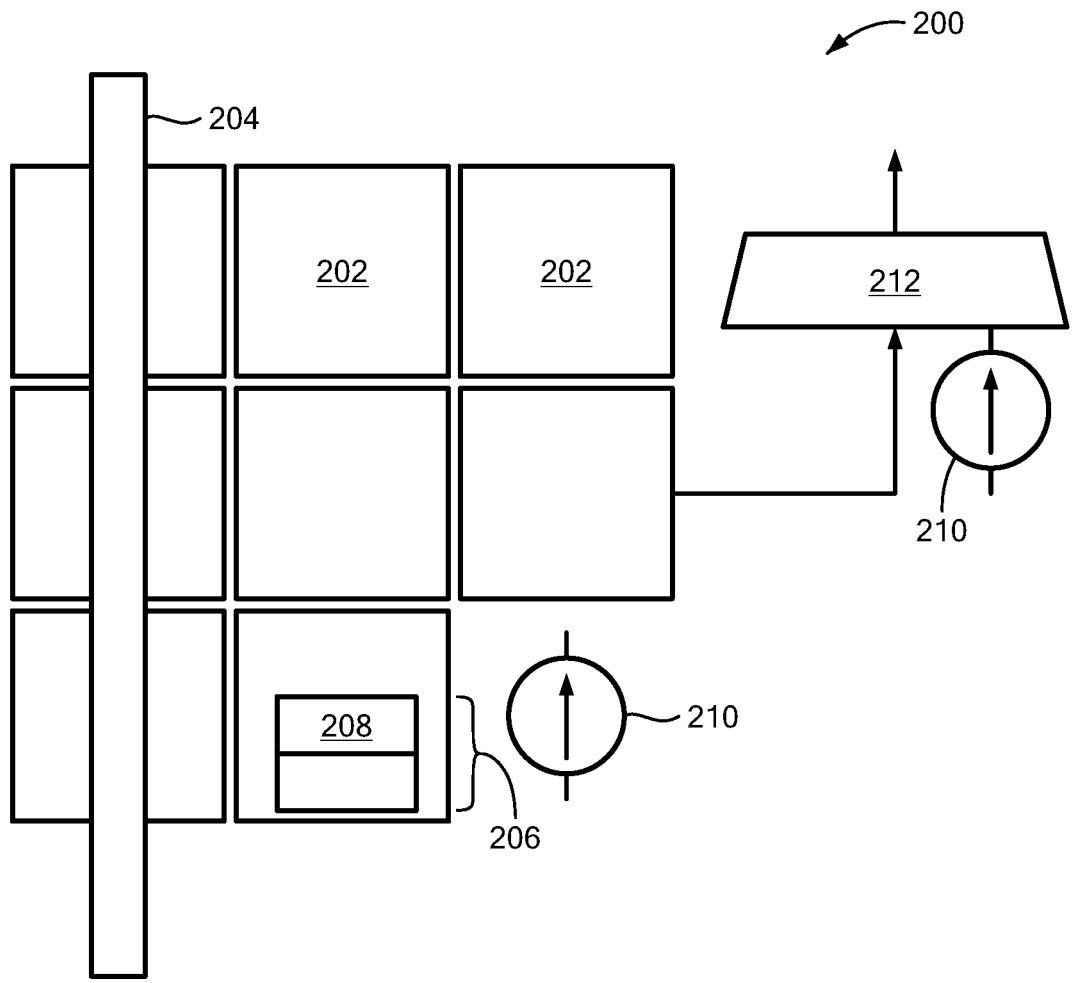
FIG. 2 is a schematic representation of a portion of pixels in a pixel array with pixel stimulation.

FIG. 2 shows a portion of a detector array 200 having a series of pixels 202 proximate to a direct photon injection mechanism. Direct photon injection refers to creating photonic energy in proximity to one or more of the pixels 202 in order to stimulate a photonic response from the detector array 200. By stimulating a known response, the full signal path of a detector system can be validated.

In one embodiment, a conductive trace 204 can be heated to a temperature that causes photons to be emitted. Conductive trace 204 may be a trace on the detector array or a wire positioned in proximity to the detector array in a package. The conductive trace may be a conductor, such as a metal, including but not limited to aluminum, copper, tungsten, or a material such as indium tin oxide. The conductive trace 204 can be heated in a controlled manner, for example applying a known current to a conductive trace 204 or wire and time to emit photons in a particular way that results in an expected response from the detector array. If the expected response is not detected, a fault can be detected.

While shown in the illustrated embodiment as aligned with centers of the pixels 202, a conductive trace 204 can be positioned in any practical location in relation to at least one pixel to meet the needs of a particular application. In addition, the geometry of the conductive trace 204 in thickness, length, height, shape etc., can vary. In some embodiments, the conductive trace 204 cross section can be cylindrical like a wire, or rectangular or trapezoidal as in a semiconductor metallization process.

In another embodiment, a PN junction 206 can be formed proximate the pixel(s) 202 to provide a light emitting diode (LED) 208) that emits photons. The PN junction 206 can be stimulated to emit photons in a particular way that results in an expected response from the detector array. If the expected response is not detected, a fault can be generated.

The PN junction 206 can be formed from any suitable material(s), such as silicon and non-silicon materials. In one embodiment, the PN junction comprises GaAs, InGaAs, or InGaAsP.

The source of stimulation may also be external to the detector array and ROIC (the focal plane array) with the ROIC providing the control to synchronize the timing and also controlling the amount of photonic stimulus. This stimulus may be included inside the package that the ROIC and APD, an example of a focal plane array (FPA), reside within. In an embodiment the stimulus can comprise an external LED diode of any size or shape as long as the placement and the additional design of the package results in the desired level of photonic energy to stimulate the pixels 202. In an embodiment the ROIC may provide a signal to a lidar system laser in a lidar system to pulse or apply a known signal at a given time.

This stimulation may interfere with the desired optical signal, as such this stimulus may be timed, but is not limited to these techniques, in one of the following ways: 1) Triggered upon an external stimulus denoting a desired self check to be run. 2) Upon start-up of the device to ensure each time it powers up that it will function properly, or 3) after it has received an actual photonic return, some time after, or after a timeout event, to enable testing after each pulse (a continuous test mode)

In other embodiments, a current source 210 can replace, or be multiplexed 212, with pixel response to simulate a response. In this way, a signal path can be stimulated and validated. In some embodiments, a light emitting pixel 202 may be substituted for a current source, by replacing a live pixel or multiplexing between the cathode or anode of the pixel. In another embodiment the light emitting pixel may be on the readout circuit and direct light when stimulated toward the detector array in a focal plane array. In some cases, this may require the detector array to be thin. Another light emitting die may be positioned separate from the detector array or the readout circuit die. This three die solution is not shown.

Figure 3:
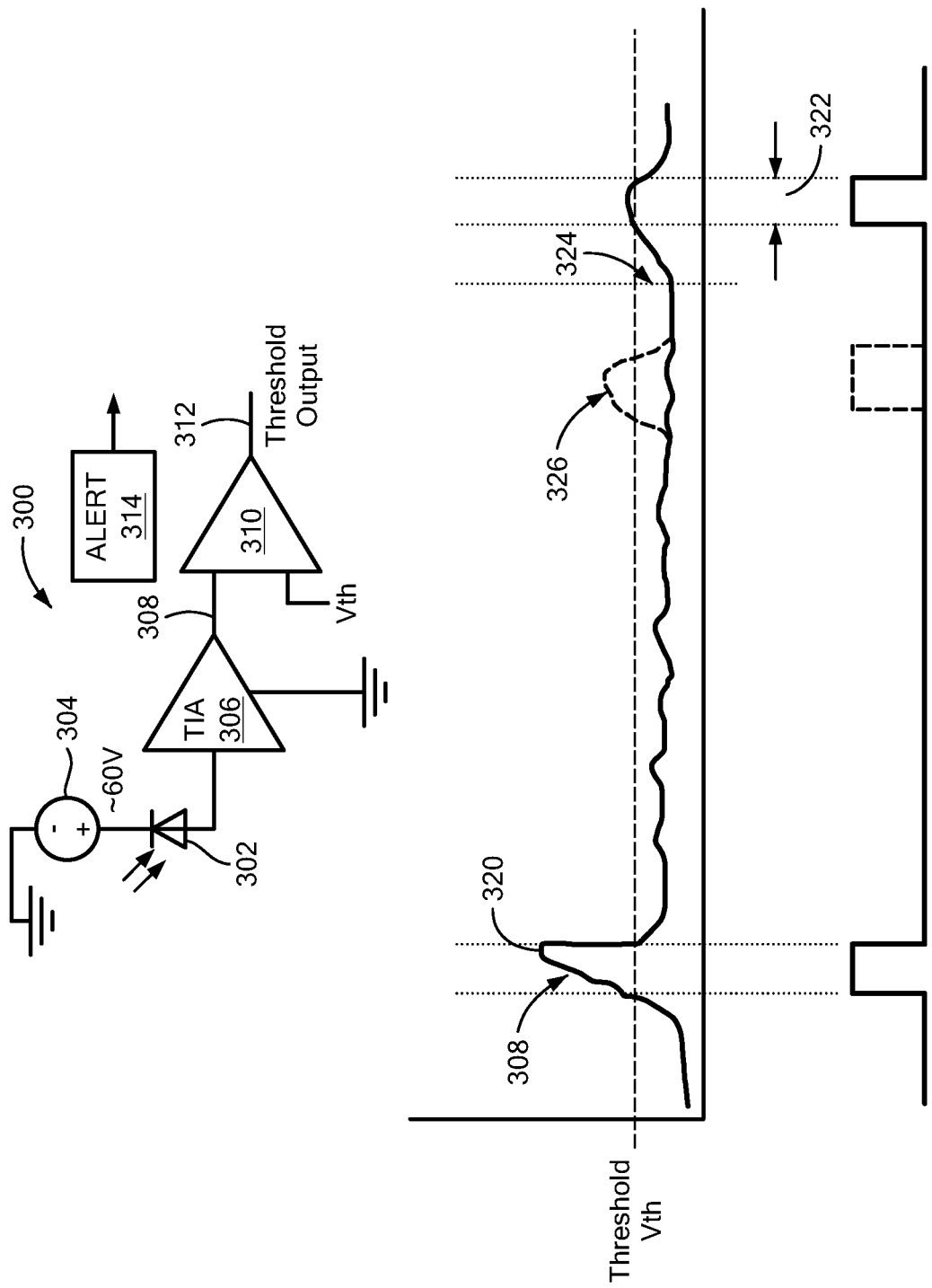
FIG. 3 is a representation of example circuit and operation of pixel response and signal timeout.

FIG. 3 shows a portion of a detector system 300, such as the system of FIG. 1, that can form part of, or be coupled to, a ROIC. It is understood that a detector system 300 can comprise a single pixel. A photodiode 302 is coupled to bias voltage 304, e.g., 60V. In the illustrated embodiment, a transimpedance amplifier (TIA) 306 is coupled to the cathode of the photodiode 302 and generates an output 308 that is provide to an input of a comparator 310. A threshold voltage Vth provides a second input to the comparator 310, which generates a threshold output signal 312. It is understood that a TIA refers to a current to voltage converter that can amplify the current from the photodiode 302. An alert module 314 can generate alerts to indicate one or more fault conditions.

In embodiments, a detector system can provide an alert at a specified maximum range to indicate that a response was not received within a certain distance. In embodiments, normal operation would not generate alerts as pulses are received and detected. As such this is an "active" indication of non-response situations. This can be used where there are known obstacles, either simulated through a fiber delay loop or actual and non-response within this interval indicates a problem with the system.

In the illustrated embodiment, the output of the amplifier 308 generates a pulse 320 generated by current from the by the photodiode 304 in response to photon detection. The pulse 320 has an amplitude that is above the voltage threshold Vth at the input of the comparator 310. Within some maximum time window 322, which corresponds to a maximum distance, the output 312 of the comparator should change state. If the comparator output 312 does not transition, an alert can be generated by the alert module 314. A trigger can correspond to no response within a set time 324 or window.

To validate detection operation, a pixel can be manipulated, or photonic stimulus generated by a heat element, LED, current source, etc., to determine whether the pixel circuit does, or does not, generate an alert when a fault occurs. In the illustrated embodiment, a test pulse 326 can be generated to test operation of the circuit and alert generation. For example, if there is an expectation a 'hit' should occur before a certain distance a time out signal, e.g., no transition of the comparator output 312, shows a malfunction. In embodiments, any practical time out can be set to meet the requirements of a particular application.

Figure 3A:
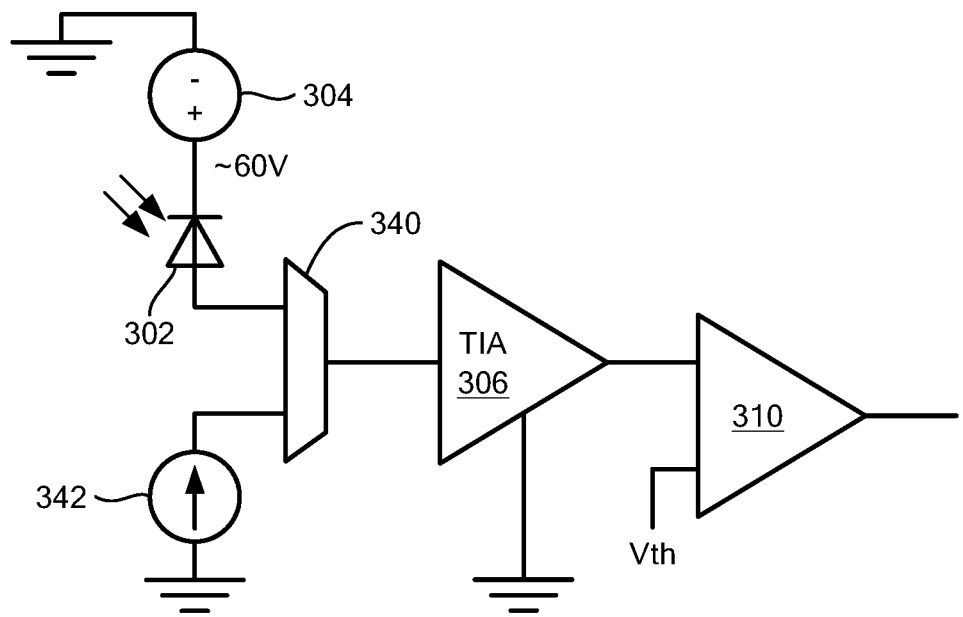
FIG. 3A is an example circuit diagram for pixel response and signal timeout with current source stimulation.

FIG. 3A shows an example circuit implementation similar to the circuit 300 of FIG. 3 with the addition of a multiplexer 340 having a first input from the photodiode 302 and a second input from a current source 342. The selected input of the multiplexer 340 can be provided to the amplifier 306. A stimulus can be generated by the current source 342 to evaluate circuit operation and alert generation, as described above.

Figure 3B:
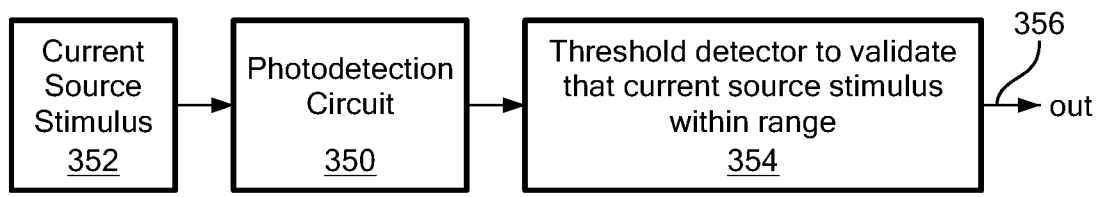
FIG. 3B is an example block diagram for the circuit of FIG. 3A.

FIG. 3B shows an example block diagram having a photodetection circuit 350 receiving an input from a stimulus module 352, which can include a current source, and generating an output to a threshold detector module 354. For example, the stimulus module 352 can generate the test pulse 326 in FIG. 3. The threshold detector module 354 can validate operation of the circuit in response to selected stimuli. For example, as described above, the threshold detector module 354 can evaluate signals against one or more thresholds. A ROIC can include an external output signal 356 that can provide an alert. In embodiments, the output signal 356 can include one or more ASIL signals that can be connected to a remote system, such as an engine control unit (ECU), an obstacle detection controller, vehicle control unit, vehicle control system, or vehicle computer.

Figure 4:
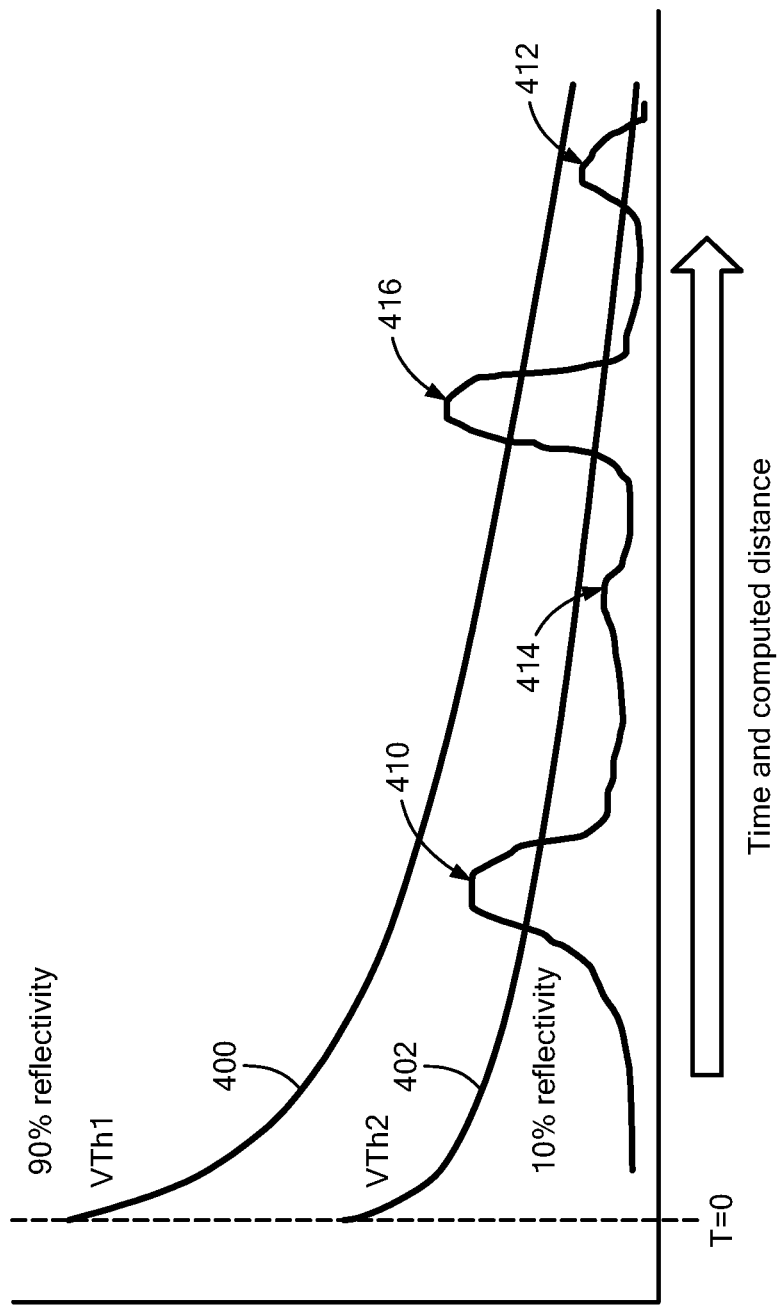
FIG. 4 is a waveform diagram of photonic energy return and voltage thresholds for reflectivity values.

FIG. 4 shows a detection system that includes functionality to reduce false detections. A first curve 400 shows amplitude over time for 90% reflectivity for a given target and a second curve 402 shows 10% reflectivity. The first curve 400 corresponds to a first voltage threshold Vth1 and the second curve 402 corresponds to a second voltage threshold Vth2.

In the illustrative embodiment, voltage pulses 410, 412 between the first and second voltage thresholds Vth1, Vth2, are generated by a likely real return. A voltage pulse 414 below the second voltage threshold Vth2 is likely noise. A voltage pulse 416 above the first voltage threshold Vth1 is likely noise.

As can be seen, decay of the returned photonic energy vs. distance is modulated by reflectivity. A range of reflectivities can be selected based on the characteristics of the transmitted pulses, expected target characteristics, expected distances, and the like. The detector can be calibrated with an actual source and the response energy can be modeled for a reasonable range of response over time. This increases safety by improving false pulse rejection. In addition, real pulses can be better discerned.

Figure 4A:
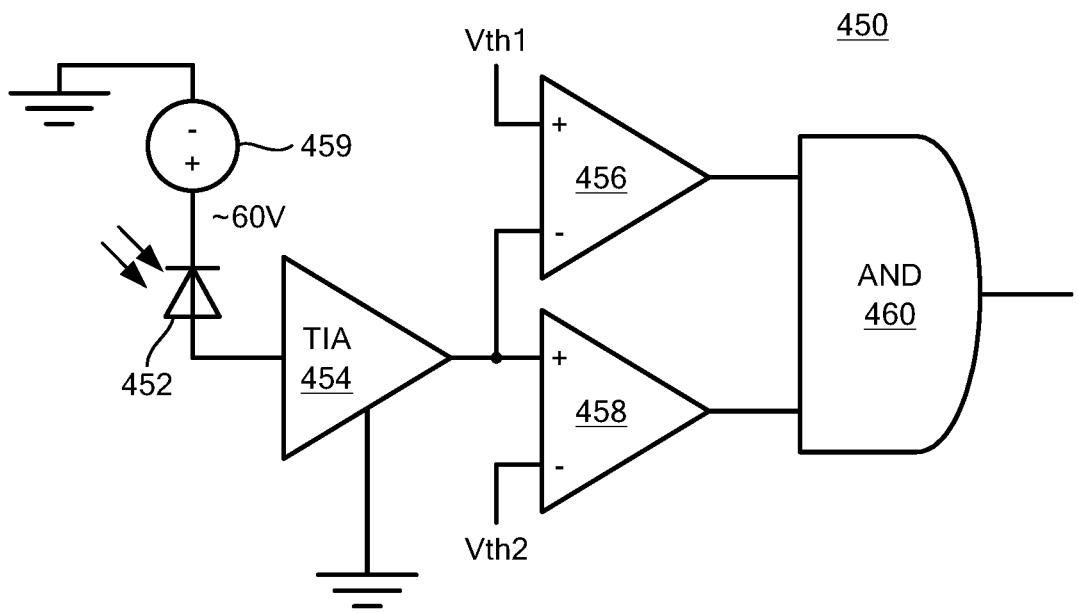
FIG. 4A is an example circuit implementation for discriminating real signal return using the reflectivity values of FIG. 4.

FIG. 4A shows an example circuit implementation 450 including a photodiode 452 providing an input to an amplifier 454 generating an output that is coupled to inputs of first and second comparators 456, 458. In the illustrated embodiment, a 60V bias voltage 459 is applied to the photodiode 452. It is understood that any practical bias voltage level can be used. A first voltage threshold Vth1 is coupled to a second input of the first comparator 456 and a second voltage threshold Vth2 is coupled to a second input of the second comparator 458. The outputs of the first and second comparators 456, 458 are provided as inputs to an AND gate 460, which changes state when the output of the amplifier 454 is between the first and second voltage thresholds Vth1, Vth2 in accordance with the first and second curves 400, 402 of FIG. 4, for example.

Figure 4B:
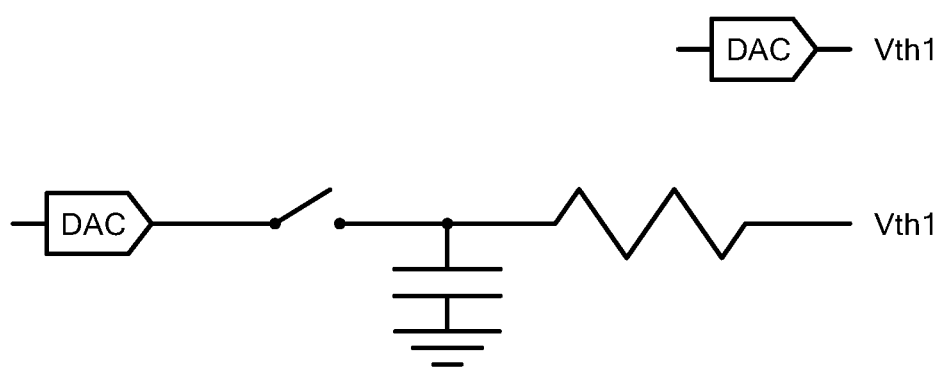
FIG. 4B is an example circuit implementation for generating the voltage thresholds of FIG. 4.

FIG. 4B shows an example implementation in which the first voltage threshold Vth1 is generated by a high speed digital-to-analog converter (DAC) or a DAC setting a decaying RC circuit.

Figure 5:
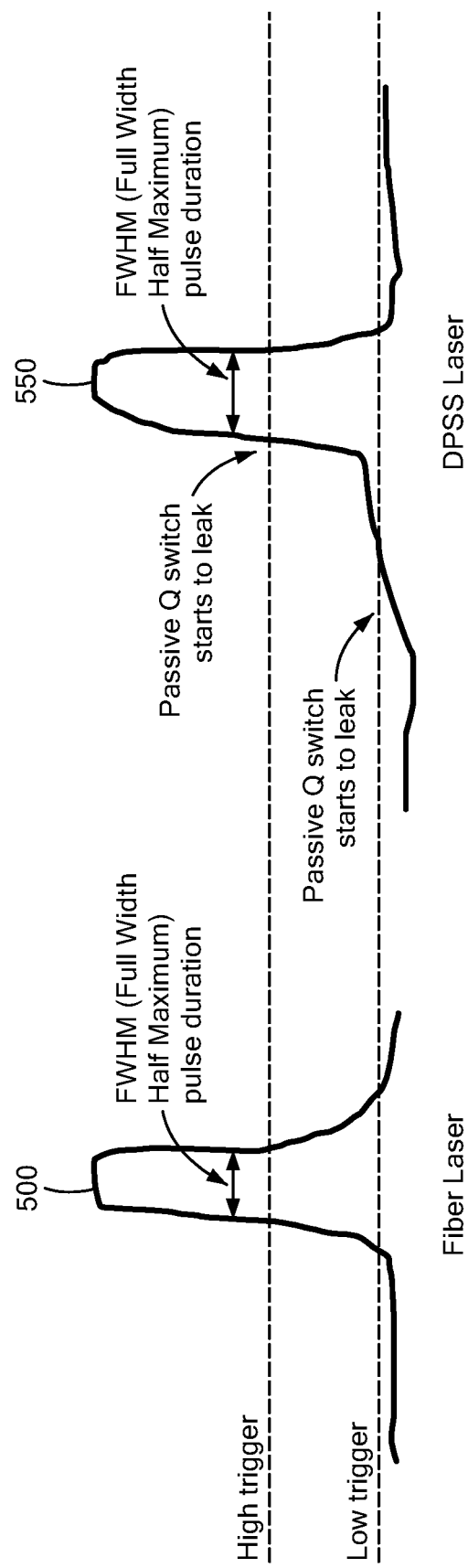
FIG. 5 is a waveform diagram showing laser pulse characteristics for different laser types that can be used to validate signals.

FIG. 5 shows an example plot of a first laser pulse 500 generated by a first type of laser, such as a fiber laser, and a second laser pulse 550 generated by a second type of laser, such as a diode pumped solid state (DPSS) laser. Each of the laser pulses 500, 550 have different patterns by which the energy is emitted. The first pulse 500 is a shorter and sharper pulse of a set time and the second pulse 550 is a longer/wider pulse with a shallower rise and steeper fall. The characteristics of the transmitted laser pulses 500, 550 can be used to enhance detection of lower energy pulses, and can also reduce erroneous detection of pulses that do not conform to the pulse characteristics.

The first laser pulse 500 can be compared to a low trigger threshold 502 and a high trigger threshold 504 to time the duration of the pulse, e.g., the time to cross the thresholds 502, 504 going up (rise) to the time to cross going down (fall). Pulses that do not conform (within margins for distance and pulse reflectivity) and/or meet certain ratio characteristics between durations can be rejected. Relatively lower energy pulses can be detected. In embodiments, thresholds similar to the thresholds Vth1, Vth2 of FIG. 4 can be used for the High Trigger and Low Trigger illustrated in FIG. 5 and similar circuitry as that shown in FIG. 4A can be used to process received pulses.

As can be seen, the DPSS laser pulse 550 has a leaky period before the laser fires that can also be timed against the durations for the high and low trigger and compared to one another.

For example, if a detector expects to receive pulses of the first type 500 pulses of the second type 502 can be discriminated, e.g., rejected as noise. In embodiments, a detector can reject pulses that are not of the expected type. For example, in automotive applications there may be a number of devices transmitting pulse of various types. By discriminating pulses from other types of lasers by pulse shape, false detections can be reduced.

In embodiments, pulse characteristics can be evaluated, for example, by design, where through manufacturing properties are understood, or characterized per unit using an offline characterization, or by using a fiber delay loop or target at a known distance with known reflectivity.

Figure 6:
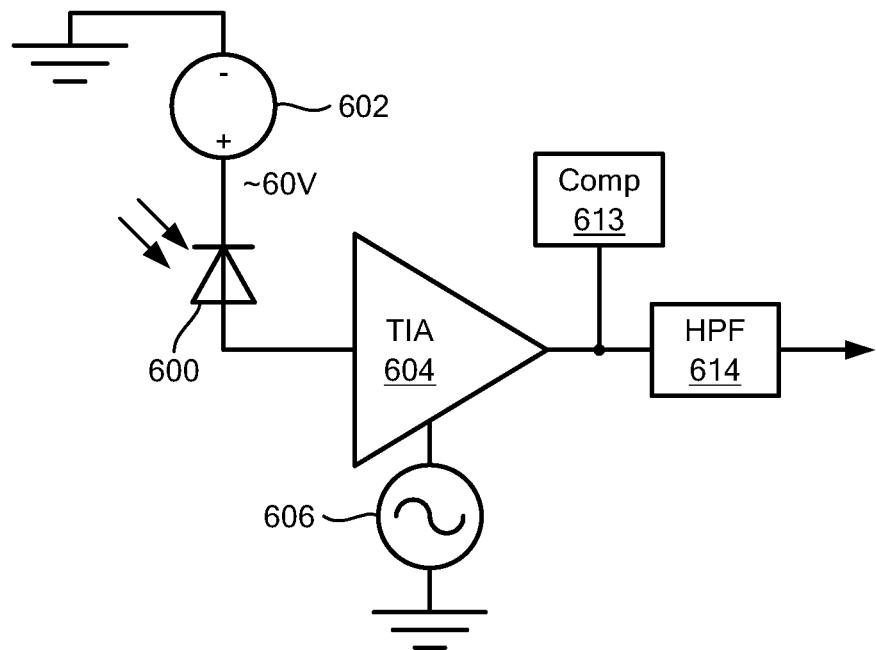
FIG. 6 is an example circuit implementation of a dynamic photodetector bias modulation.

FIG. 6 shows an example circuit implementation of a part of a photodetector having bias modulation to detect circuit malfunction. A photodetector can be biased on two terminals, such as a common cathode (coupled to other cathodes) at a higher external voltage and an internal point at a lower voltage that is below a current measuring circuit, e.g., a TIA. The lower bias point is modulated to generate a known signal at a known frequency. Certain characteristics of the response are based on the bias, such as "dark-current", but also gain and other characteristics. By coupling to and measuring the signal at the known injection frequency, one can monitor the health and function of the photodiode by comparing this response at the known frequency to the expected response. Deviation from this response can be used to trigger a safety condition where the photodetector is considered to not be operating properly.

In an example embodiment, a photodiode 600 has a cathode coupled to a bias voltage source 602 and an anode coupled to the input of an amplifier 604, such as a TIA. An AC modulator 606 is coupled to the amplifier 604 so that the output of the amplifier is modulated by the signal from the modulator. A high pass filter 614 can filter out the modulation signal.

Figure 6A:
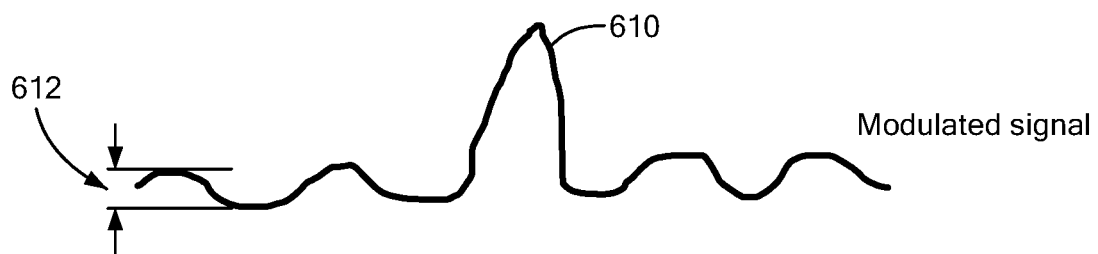
FIG. 6A is an example of a modulated signal.
Figure 6B:
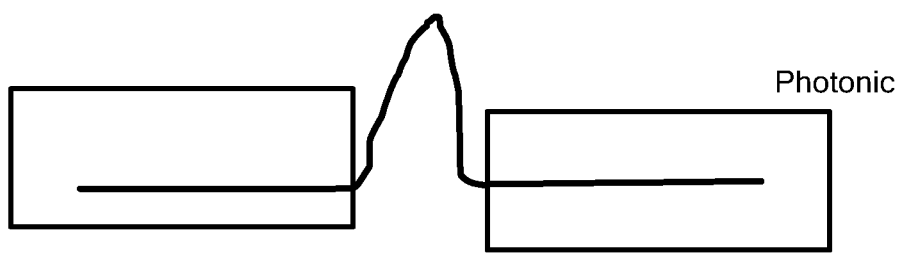
FIG. 6B is an example of a Photonic signal.

As can be seen in FIG. 6A, the modulated signal from the output of the amplifier 604 includes a pulse 610 from the photodiode 600 and a modulation signal amplitude 612 matching an expected output generated by the AC modulation signal from the modulator 606. The modulation signal in the amplifier 604 output is indicative of proper operation of the circuit. As shown in FIG. 6B, a photonic output can be generated after the high pass filter (set above the modulation frequency) 614 filters the amplifier output to remove the modulation signal. With this arrangement, photodiode 600 function can be checked. A signal comparison/evaluation module 613 can compare expected signals to actual signals to detect faults and/or generate alerts.

In other embodiments, a signal from the bias voltage source 602 can be modulated through the photodiode 600. By detecting the modulated signal pulses/amplitude at the output of the amplifier 604, operation of the photodiode 600 can be checked.

Figure 7:
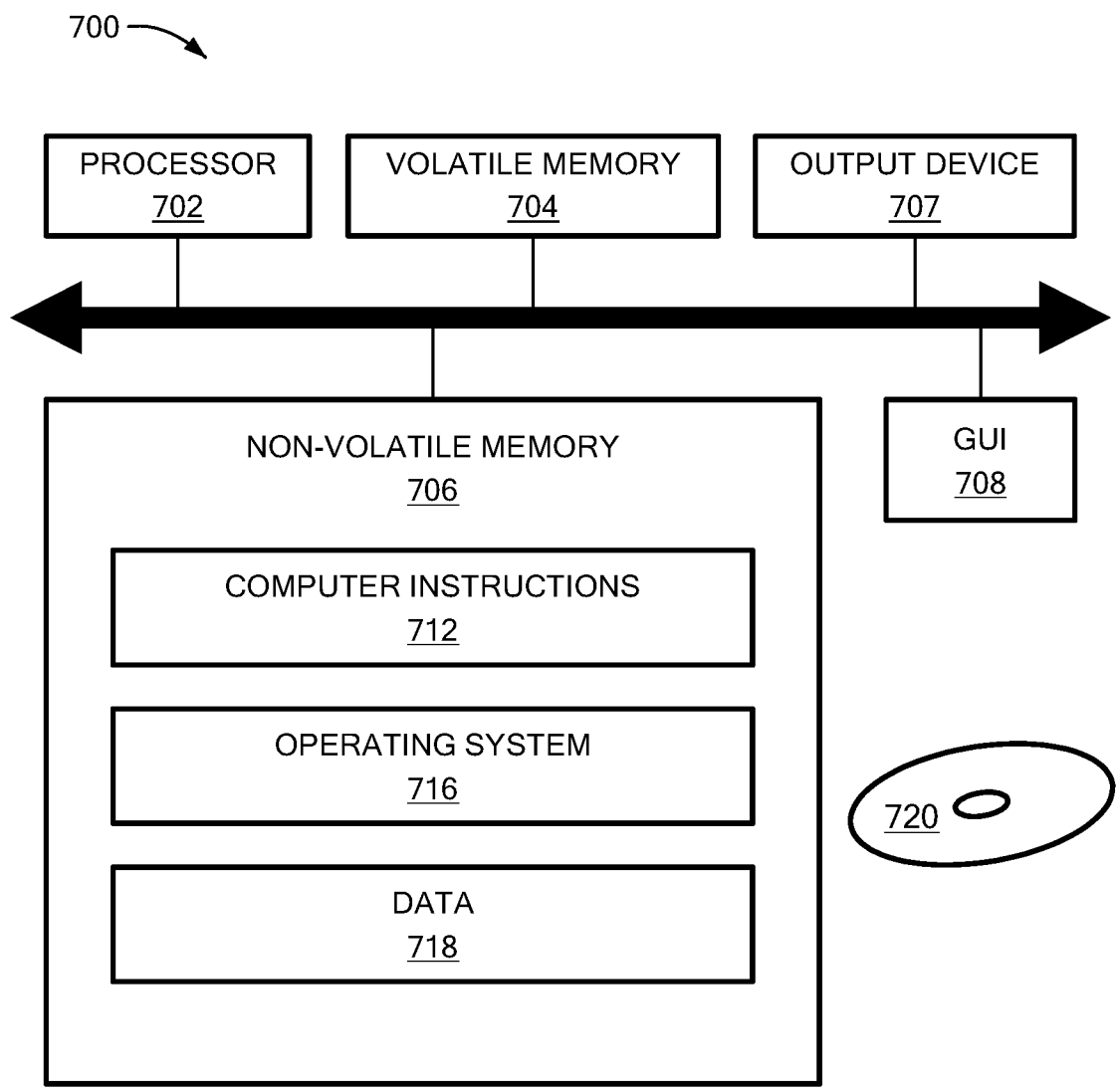
FIG. 7 is a schematic representation of an example computer that can perform at least a portion of the processing described herein.

FIG. 7 shows an exemplary computer 700 or controller that can perform at least part of the processing described herein. For example, the computer 700 can perform processing to implement a mask controller, such as the select module 214 of FIG. 2, for example, as well as the steps in FIG. 5. The computer 700 includes a processor 702, a volatile memory 704, a non-volatile memory 706 (e.g., hard disk, or other memory such as FLASH, EEPROM, or RAM), an output device 707 and a voice control unit, and/or a graphical user interface (GUI) 708 (e.g., a mouse, a keyboard, a display, for example). The non-volatile memory 706 stores computer instructions 712, an operating system 716 and data 718. In one example, the computer instructions 712 are executed by the processor 702 out of volatile memory 704. In one embodiment, an article 720 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., RAM/ROM, including FLASH memory, or EEPROM, CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array), a general purpose graphical processing units (GPGPU), and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
receiving a return laser pulse at a detector system having pixels in a pixel array;
analyzing a response of the pixels in the pixel array including comparing the response to at least one threshold corresponding to decay of photonic energy of the laser pulse over distance and target reflectivity; and
generating an alert signal based on the response of the pixels in the pixel array, wherein the at least one threshold comprises a first threshold corresponding to a first reflectivity and a second threshold corresponding to a second reflectivity.

2. The method according to claim 1, wherein a readout integrated circuit controls a laser that generates the return laser pulse.

3. The method according to claim 1, wherein analyzing the response comprises determining that real return for the laser pulse corresponds to the response of the pixels in the pixel array being between the first and second thresholds.

4. The method according to claim 3, wherein analyzing the response comprises determining that noise corresponds to the response of the pixels in the pixel array being below the second threshold.

5. The method according to claim 4, wherein analyzing the response comprises determining that noise corresponds to the response of the pixels in the pixel array being above the first threshold.

6. The method according to claim 1, wherein the at least one threshold comprises a first threshold corresponding to a low trigger for a pulse generated by a first type of laser and a second threshold corresponding to a high trigger for the pulse generated by the first type of laser.

7. The method according to claim 6, further including determining a first time from the returned laser pulse exceeding the first threshold to the returned pulse exceeding the second threshold.

8. The method according to claim 7, further including determining based on the first time that the returned laser pulse was generated by a second type of laser that is different from the first type of laser.

9. The method according to claim 8, further including determining that the returned laser pulse was generated by a second type of laser that is different from the first type of laser based upon a pulse width of the returned laser pulse.

10. The method according to claim 7, wherein the first time corresponds to the laser type comprising a fiber laser.

11. The method according to claim 7, wherein the first time corresponds to the laser type comprising a DPSS laser.

12. A detector system, comprising
a detector to receive a return laser pulse, wherein the detector comprises pixels in a pixel array;
a first module configured to analyze a response of the pixels in the pixel array including comparing the response to at least one threshold corresponding to decay of photonic energy of the laser pulse over distance and target reflectivity; and
an alert signal configured to generate an alert based on the response of the pixels in the pixel array, wherein the at least one threshold comprises a first threshold corresponding to a first reflectivity and a second threshold corresponding to a second reflectivity.

13. The system according to claim 12, wherein a readout integrated circuit is configured to control a laser that generates the return laser pulse.

14. The system according to claim 12, wherein analyzing the response comprises determining that real return for the laser pulse corresponds to the response of the pixels in the pixel array being between the first and second thresholds.

15. The system according to claim 14, wherein analyzing the response comprises determining that noise corresponds to the response of the pixels in the pixel array being below the second threshold.

16. The system according to claim 15, wherein analyzing the response comprises determining that noise corresponds to the response of the pixels in the pixel array being above the first threshold.

17. The system according to claim 12, wherein the at least one threshold comprises a first threshold corresponding to a low trigger for a pulse generated by a first type of laser and a second threshold corresponding to a high trigger for the pulse generated by the first type of laser.

18. The system according to claim 17, wherein the system is further configured to determine a first time from the returned laser pulse exceeding the first threshold to the returned pulse exceeding the second threshold.

19. The system according to claim 18, wherein the system is further configured to determine based on the first time that the returned laser pulse was generated by a second type of laser that is different from the first type of laser.

20. The system according to claim 19, wherein the system is further configured to determine that the returned laser pulse was generated by a second type of laser that is different from the first type of laser based upon a pulse width of the returned laser pulse.

21. The system according to claim 18, wherein the first time corresponds to the laser type comprising a fiber laser.

22. The system according to claim 18, wherein the first time corresponds to the laser type comprising a DPSS laser.

23. A method, comprising:
   employing an amplifier to amplify signals from a photodetector forming part of a detector system having a pixel array;
   applying an AC modulation signal to the amplifier, wherein an output signal of the amplifier includes a pulse signal generated by pixels in a pixel array contained in a detector system and the AC modulation signal;
   analyzing an output signal from the amplifier to detect a fault in operation of the photodetector; and
   filtering the AC modulation signal from the output signal of the amplifier.

24. The method according to claim 23, further including evaluating operation of the photodetector.

25. The method according to claim 24, further including generating an alert based on the evaluating of the photodetector.

* * * * *